(12) United States Patent
Kubota et al.

(10) Patent No.: US 9,391,052 B2
(45) Date of Patent: Jul. 12, 2016

(54) SEMICONDUCTOR DEVICE

(71) Applicant: SHINKO ELECTRIC INDUSTRIES CO., LTD., Nagano-shi, Nagano (JP)

(72) Inventors: Kazuyuki Kubota, Nagano (JP); Tomoharu Fujii, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/167,291

(22) Filed: Jan. 29, 2014

(65) Prior Publication Data

US 2014/0210082 A1 Jul. 31, 2014

(30) Foreign Application Priority Data

Jan. 31, 2013 (JP) .................................. 2013-016676

(51) Int. Cl.

| H01L 23/48 | (2006.01) |
| H01L 25/10 | (2006.01) |
| H01L 23/66 | (2006.01) |
| H05K 1/14 | (2006.01) |
| H01L 25/18 | (2006.01) |
| H05K 3/34 | (2006.01) |

(52) U.S. Cl.
CPC ............. *H01L 25/105* (2013.01); *H01L 23/66* (2013.01); *H05K 1/144* (2013.01); *H01L 25/18* (2013.01); *H01L 2223/6677* (2013.01); *H01L 2225/1023* (2013.01); *H01L 2225/1058* (2013.01); *H01L 2924/0002* (2013.01); *H01L 2924/15311* (2013.01); *H05K 3/3436* (2013.01); *H05K 2201/042* (2013.01); *H05K 2201/10098* (2013.01)

(58) Field of Classification Search
CPC .............................. H01L 24/13; H01L 24/66
USPC ................................................. 257/738, 774
See application file for complete search history.

(56) References Cited

U.S. PATENT DOCUMENTS

| 2007/0182012 A1* | 8/2007 | DeRaedt et al. | 257/738 |
| 2007/0194427 A1* | 8/2007 | Choi et al. | 257/686 |
| 2009/0267221 A1* | 10/2009 | Fujii | 257/698 |
| 2012/0097978 A1* | 4/2012 | Ouchi | 257/77 |
| 2014/0140031 A1* | 5/2014 | Fujita et al. | 361/803 |
| 2014/0151860 A1* | 6/2014 | Nakamura et al. | 257/664 |
| 2014/0176368 A1* | 6/2014 | Kamgaing et al. | 343/700 MS |

FOREIGN PATENT DOCUMENTS

| JP | 2007-324231 | 12/2007 |
| WO | WO 2013/084496 A1 * | 6/2013 |

* cited by examiner

*Primary Examiner* — Christine Enad
(74) *Attorney, Agent, or Firm* — Rankin, Hill & Clark LLP

(57) ABSTRACT

There is provided a semiconductor device. The semiconductor device includes: a first board; a second board joined to the first board; a connection terminal provided between the first board and the second board and electrically connecting the first board and the second board; and an electronic component on at least one of the first board and the second board. The connection terminal serves as an antenna.

15 Claims, 9 Drawing Sheets

US 9,391,052 B2

SEMICONDUCTOR DEVICE

This application claims priority from Japanese Patent Application No. 2013-016676, filed on Jan. 31, 2013, the entire contents of which are herein incorporated by reference.

BACKGROUND OF THE INVENTION

1. Technical Field

The present disclosure relates to a semiconductor device.

2. Description of the Related Art

In the related art, semiconductor devices incorporating electronic components such as active elements and passive elements have various structures. In recent years, semiconductor devices having a wireless communication module incorporating, for example, a radio-frequency (RF) communication unit, a control unit, a crystal oscillator or the like have come to be used frequently in various fields. To perform a wireless communication using an antenna, such semiconductor devices are equipped with an antenna that is connected to the RF communication unit or the like (see e.g., JP-A-2007-324231).

FIG. 12 is a plan view of a related-art semiconductor device having an antenna 120. As shown in FIG. 12, the related-art semiconductor device 100 includes a wiring board 110 and a control IC chip 132 and an RF IC chip 131 which are mounted on the wiring board 110.

FIG. 13 is a plan view of the wiring board 110 in the related art. In FIG. 13, reference symbol R11 denotes a region where the RF IC chip 131 is to be mounted (hereinafter referred to as an RF IC mounting region R11) and symbol R12 denotes a region where the control IC chip 132 is to be mounted (hereinafter referred to as a control IC mounting region R12).

As shown in FIG. 13, the wiring board 110 has a board body 111, connection pads 112-115, traces 117-119, and an antenna 120. Each side surface of the board body 111 is formed with plural notches 111X. Each notch 111X is formed so as to assume a semicylindrical shape and to reach the top surface and the bottom surface of the board body 111.

The connection pads 112 and 113 are formed in the RF IC mounting region R11 of the top surface of the board body 111, and are electrically connected to the RF IC chip 131. The connection pads 112 are electrically connected to edge electrodes 116 via the traces 117, respectively. The connection pads 113 are electrically connected to connection pads 115 via the traces 118, respectively.

The connection pads 114 and 115 are formed in the control IC mounting region R12 of the top surface of the board body 111, and are electrically connected to the control IC chip 132. The connection pads 114 are electrically connected to edge electrodes 116 via the traces 119, respectively.

As shown in FIG. 14, the antenna 120 has wiring members 121 which are formed on the top surface of the board body 111, wiring members 122 which are formed on the bottom surface of the board body 111, and connection members 123 which are formed on respective notches 111X. The wiring members 121 and 122 and the connection members 123 are electrically connected mutually. The antenna 120 is electrically connected to the RF IC chip 131 shown in FIG. 12.

Forming the portions (i.e., connection members 123) of the antenna 120 on the side surface of the board body 111 makes it possible to decrease an area of the top surface of the board body 111 which is occupied by the antenna 120 than in the case where the antenna is formed only on the top surface of the board body 111.

However, in the above wiring board 110, the wiring length of the antenna 120 depends on the thickness of the board body 111. Therefore, when the board body 111 is thin, it is impossible to secure sufficient wiring lengths of the antenna 120 utilizing the connection members 123, resulting in difficulty designing a low-frequency antenna that requires a long wiring length. In this case, to design a low-frequency antenna, it is necessary to form long wiring members 121 and 122 on the top surface and the bottom surface, respectively, of the board body 111, which means increase in the areas occupied by the wiring members 121 and 122. That is, when the board body 111 is thin, a problem arises that it is difficult to reduce the horizontal area of the board body 111, that is, to miniaturize the board body 111, which in turn makes it difficult to miniaturize the semiconductor device 100 having the board body 111.

SUMMARY OF THE INVENTION

According to one or more aspects of the present invention, there is provided a semiconductor device. The semiconductor device includes: a first board; a second board joined to the first board; a connection terminal provided between the first board and the second board and electrically connecting the first board and the second board; and an electronic component on at least one of the first board and the second board. The connection terminal serves as an antenna.

DETAILED DESCRIPTION

An embodiment will be hereinafter described with reference to the accompanying drawings. In the accompanying drawings, for the sake of convenience in facilitating understanding of an important feature, a related portion may be enlarged. Therefore, for example, the ratio between dimensions of each constituent element is not necessarily the same as an actual ratio. In each sectional view, to facilitate understanding of the sectional structures of individual members, hatching of part of them may be omitted.

First, the configuration of a semiconductor device 10 will be described. The embodiment is directed to an example that an antenna 30 which is an inverted-F antenna is provided so as to bridge two wiring boards (first board 20 and second board 40).

Figure 1A:
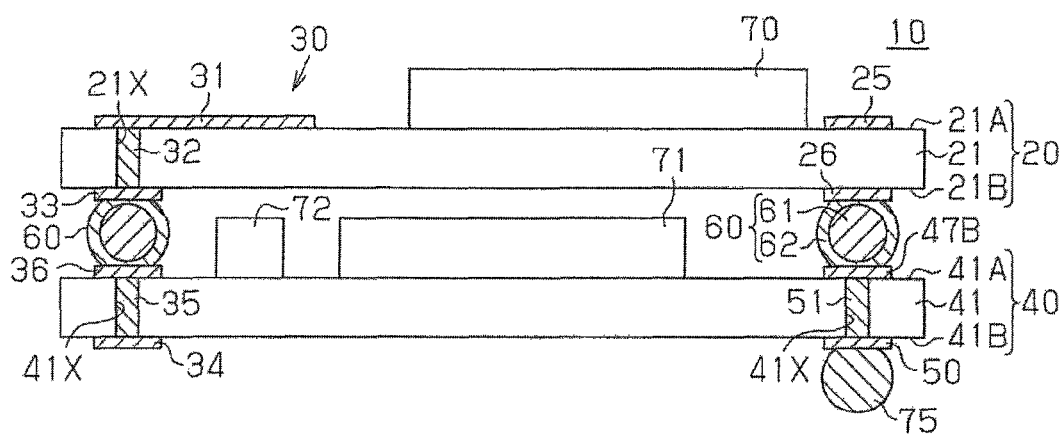
FIG. 1A is a schematic sectional view, taken along lines 1a-1a in FIGS. 2 and 3, of a semiconductor device according to an embodiment.
Figure 1B:
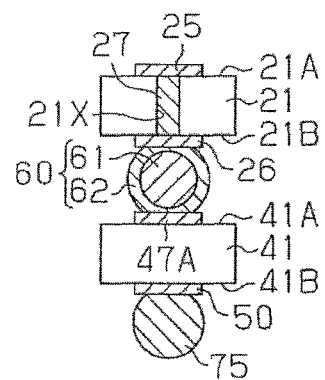
FIG. 1B is a schematic sectional view, taken along lines 1b-1b in FIGS. 2 and 3, of the semiconductor device according to the embodiment.

As shown in FIGS. 1A and 1B, the semiconductor device 10 includes the first board 20, the second board 40, and cored solder balls 60 which electrically connect the first board 20 and the second board 40. The first board 20 and the second board 40 are provided with the antenna 30 which includes part of the cored solder balls 60.

Figure 2:
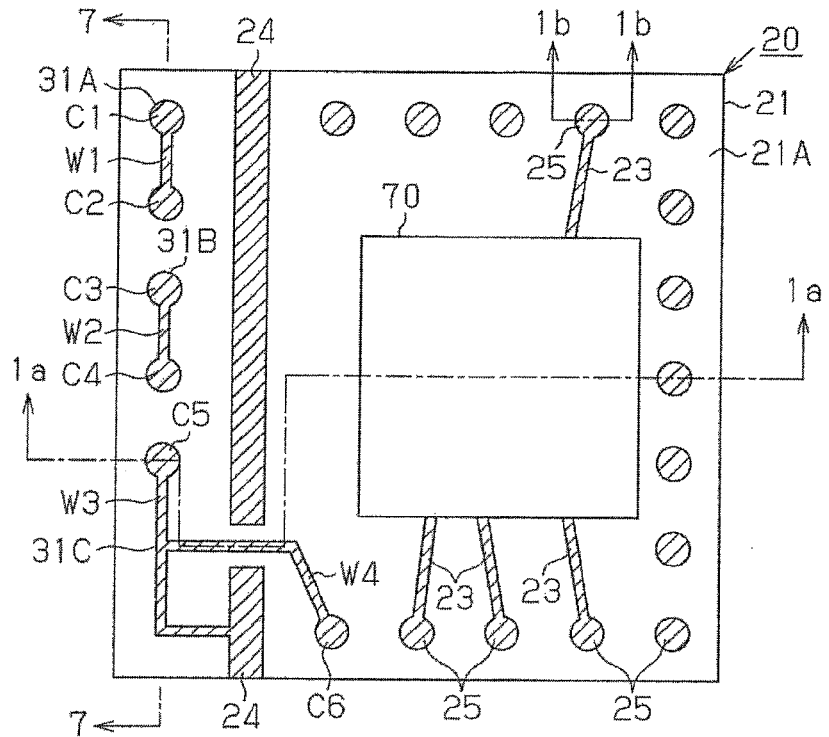
FIG. 2 is a schematic plan view of part of the semiconductor device according to the embodiment.

As shown in FIGS. 1A and 2, the top surface of the first board 20 is mounted with a semiconductor chip 70 which is an active element. For example, a control IC chip such as a CPU (central processing unit) chip can be used as the semiconductor chip 70. In the following description, the semiconductor chip 70 may also be referred to as a control IC chip 70.

Figure 3:
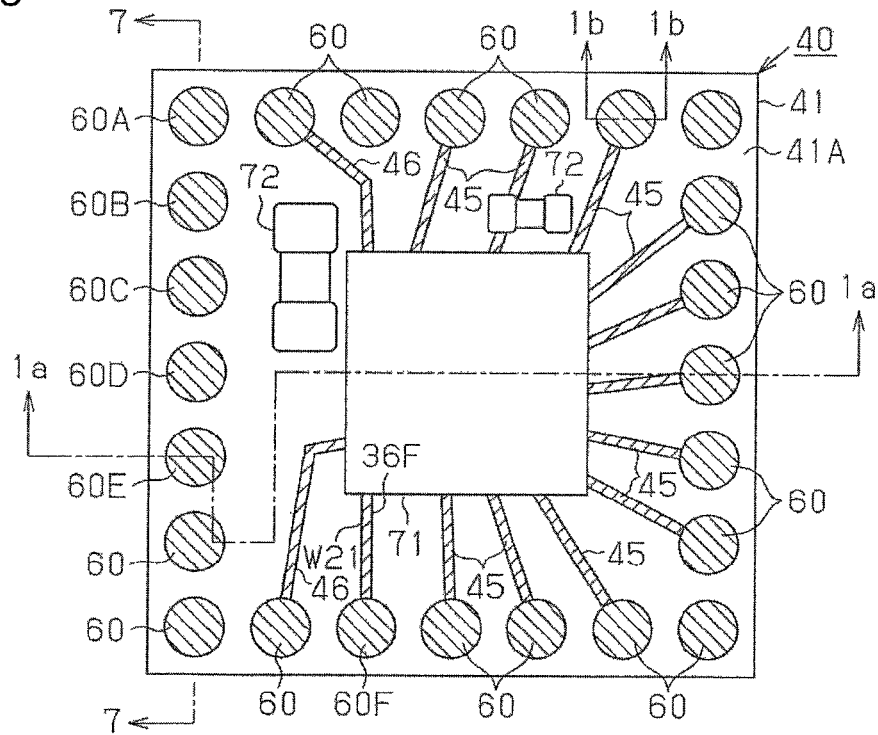
FIG. 3 is a schematic plan view of another part of the semiconductor device according to the embodiment.

As shown in FIGS. 1A and 3, the top surface of the second board 40 is mounted with a semiconductor chip 71 which is an active element and passive elements 72. For example, an RF IC (radio-frequency integrated circuit) chip can be used as the semiconductor chip 71. In the following description, the semiconductor chip 71 may also be referred to as an RF IC chip 71. For example, chip capacitors, chip inductors, and chip resistors can be used as the passive elements 72. Traces connected to the passive elements 72 are omitted in FIG. 3. As shown in FIG. 1A, the bottom surface of the second board 40 is formed with external connection terminals 75 which are terminals for electrical connection to a mounting board such as a mother board. For example, solder balls can be used as the external connection terminals 75.

Figure 4:
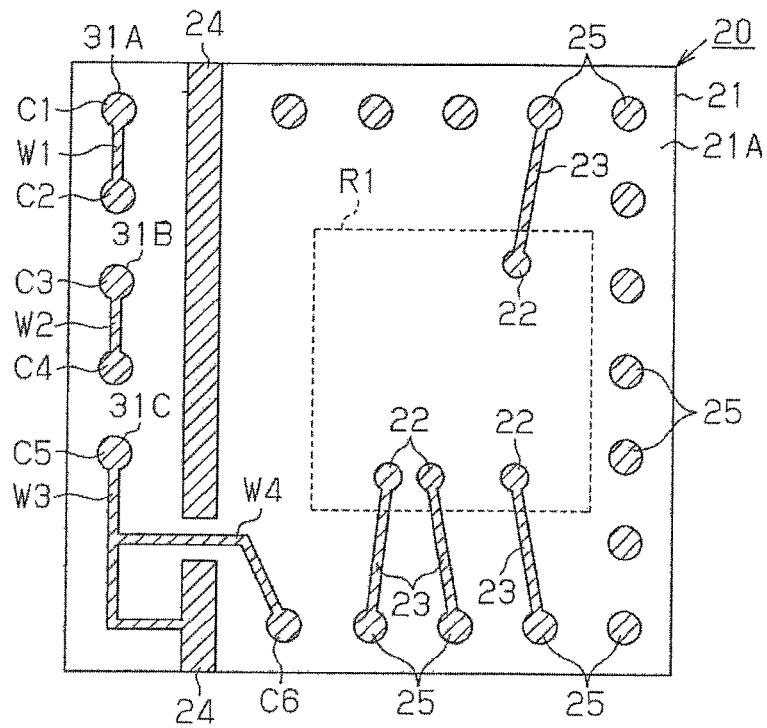
FIG. 4 is a schematic plan view of a first board used in the embodiment.

Next, the configuration of the first board 20 will be described with reference to FIGS. 1A and 1B and FIG. 4. FIG. 4 is a top view of the first board 20 shown in FIG. 1A. In FIG. 4, reference symbol R1 denotes a region where the control IC chip 70 is to be mounted (hereinafter referred to as a control IC mounting region R1).

The first board 20 has a first board body 21, connection pads 22, traces 23, ground lines 24, and connection members 25 which are formed on the top surface 21A of the first board body 21, connection pads 26 formed on the bottom surface 21B of the first board body 21, and the above-mentioned antenna 30. It suffices that the first board body 21 be formed in such a manner that the connection members 25 and the connection pads 26 which are formed on the top surface 21A and the bottom surface 21B of the first board body 21, respectively, are electrically connected mutually by lines formed inside the first board body 21. Therefore, wiring layers may be formed inside the first board body 21 but need not always be done so. Where wiring layers are formed inside the first board body 21, they are stacked via interlayer insulating layers and the connection members 25 and the connection pads 26 are electrically connected by vias that are formed through the wiring layers and the insulating layers. For example, a cored buildup board having a core substrate or a coreless board having no core substrate can be used as the first board body 21. For example, such a first board body 21 may be about 0.2 to 1.0 mm in thickness.

The connection pads 22 are formed in the control IC mounting region R1 of the top surface 21A of the first board body 21. The connection pads 22 are pads that are to be electrically connected to the control IC chip 70. The connection pads 22 are electrically connected to the connection members 25 via the traces 23, respectively. A connection pad 22, a trace 23, and a connection member 25 that are connected to each other are integrated together. For example, the connection pads 22 and the connection members 25 are approximately circular in a plan view and the traces 23 are approximately band-shaped in a plan view. The connection pads 22, the connection members 25, and the connection members 25 may be made of copper or a copper alloy, for example.

The ground lines 24 extend across the top surface 21A of the first board body 21 in the top-bottom direction in FIG. 4 so as to assume approximately band-like shapes. The ground lines 24 are electrically connected to the antenna 30 and given a ground potential. The ground lines 24 may be made of copper or a copper alloy, for example.

The connection members 25 are formed in an outer peripheral region of the top surface 21A of the first board body 21. As shown in FIG. 1B, part of the connection members 25 are electrically connected to part of via electrodes 27, respectively, which penetrate through the first board body 21 in its thickness direction. The via electrodes 27 are formed in respective through-holes 21X which penetrate through the first board body 21 so as to reach its top surface 21A and bottom surface 21B. The through-holes 21X are filled with the respective via electrodes 27. The top ends of the via electrodes 27 are connected to the above connection members 25, and their bottom ends are connected to part of the connection pads 26, respectively. Thus, the above connection members 25 and connection pads 26 are electrically connected mutually by these via electrodes 27, respectively. The connection pads 26 are pads that are to be joined to cored solder balls 60 and electrically connected to connection pads 47A, 47B, and 47C of the second board 40 by these cored solder balls 60, respectively. Although not shown in any drawings, the connection pads 26 are, for example, approximately circular in a plan view.

The via electrodes 27 and the connection pads 26 are made of copper or a copper alloy, for example. Although in the embodiment the through-holes 21X are filled with the via electrodes 27 made of a conductive material such as copper, via electrodes may be formed as plated through-hole vias in the respective through-holes 21X.

Although actually the above-described traces 23, ground lines 24, and connection members 25 are covered with a solder resist layer, the solder resist layer is not shown in FIGS. 1A and 1B to facilitate understanding of the sectional structures of the individual members.

Figure 5:
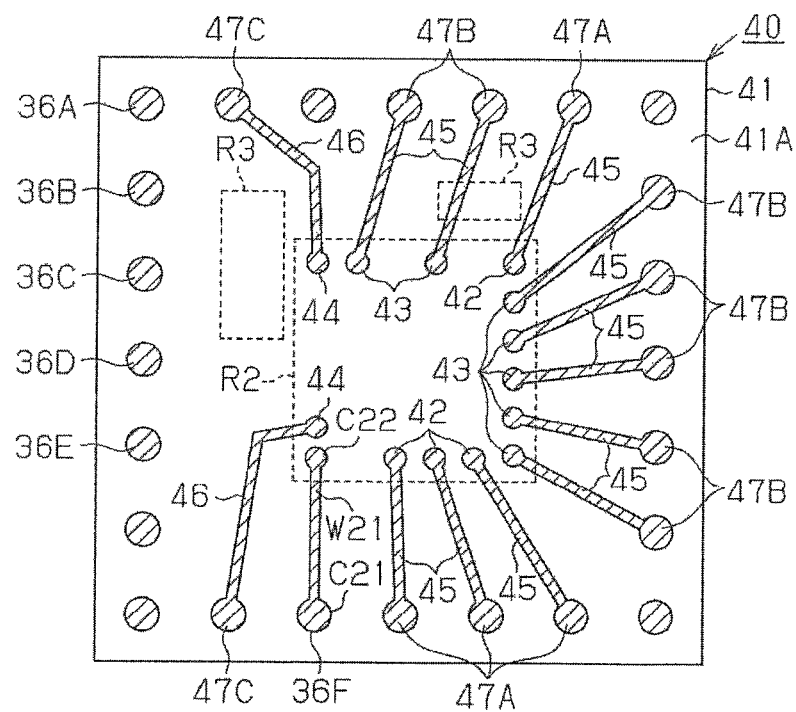
FIG. 5 is a schematic plan view of a second board used in the embodiment.
Figure 6:
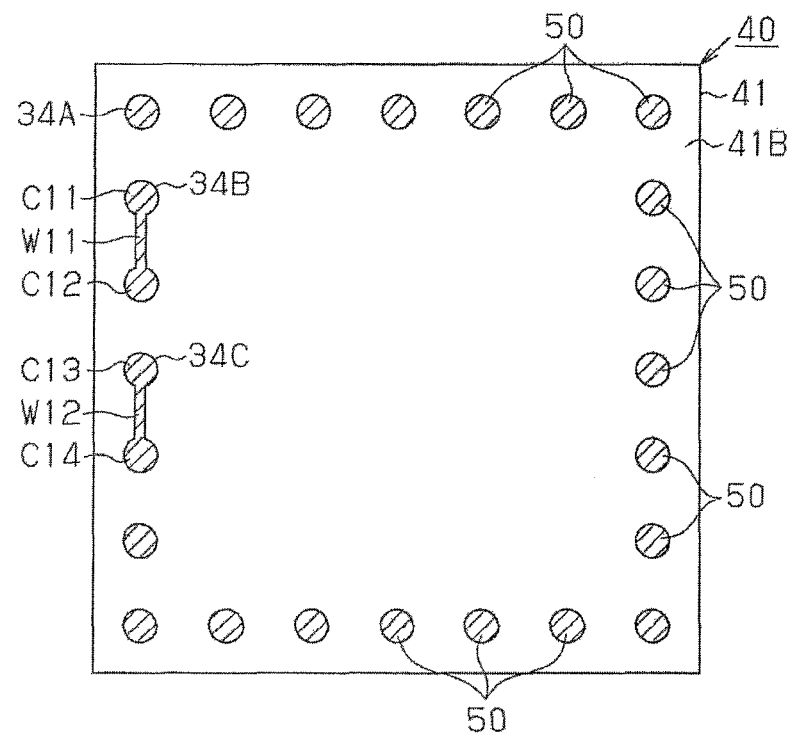
FIG. 6 is a schematic bottom view of the second board used in the embodiment.

Next, the configuration of the second board 40 will be described with reference to FIGS. 1A and 1B, 5, and 6. FIG. 5 is a top view of the second board 40 shown in FIG. 1A, and FIG. 6 is bottom view of the second board 40 shown in FIG. 1A. In FIG. 5, reference symbol R2 denotes a region where the RF IC chip 71 is to be mounted (hereinafter referred to as an RF IC mounting region R2) and symbol R3 denotes regions where the passive elements 72 are to be mounted (hereinafter referred to as passive element mounting regions R3).

The second board 40 has a second board body 41, connection pads 42, 43, and 44, traces 45, ground lines 46, and connection pads 47A, 47B, and 47C which are formed on the top surface 41A of the second board body 41, connection pads 50 formed on the bottom surface 41B of the second board body 41, and the above-mentioned antenna 30. It suffices that the second board body 41 be formed in such a manner that at least the connection pads 47B among the connection pads 47A-47C formed on the top surface 41A of the second board body 41 and the corresponding connection pads 50 formed on the bottom surface 41B of the second board body 41 be electrically connected mutually by lines formed inside the second board body 41. Therefore, wiring layers may be formed inside the second board body 41 but need not always be done so. Where wiring layers are formed inside the second board body 41, they are stacked via interlayer insulating layers and the connection pads 47B and the connection pads 50 are electrically connected by vias that are formed through the wiring layers and the insulating layers. For example, a cored built-up board having a core substrate or a coreless board having no core substrate can be used as the second board body 41. For example, such a second board body 41 may be about 0.2 to 1.0 mm in thickness.

The connection pads 42, 43, and 44 are formed in the RF IC mounting region R2 of the top surface 41A of the second board body 41. The connection pads 42-44 are pads that are to be electrically connected to the RF IC chip 71. For example, the connection pads 42-44 are approximately circular in a plan view.

The connection pads 47A, 47B, and 47C (hereinafter may be referred to generically as connection pads 47) are formed in a peripheral region of the top surface 41A of the second board body 41. The connection pads 47A-47C are pads that are to be joined to the respective cored solder balls 60. For example, the connection pads 47A-47C are approximately circular in a plan view. The connection pads 42-44 and the connection pads 47A-47C may be made of copper or a copper alloy, for example.

The connection pads 42 are electrically connected to the connection pads 47A by the corresponding traces 45, respectively. The connection pads 47A are to be electrically connected to part of the connection pads 26 of the first board 20 by the cored solder balls 60, respectively (see FIG. 1B). Therefore, the connection pads 42 are to be electrically connected to the corresponding connection pads 22 via the corresponding traces 45, the connection pads 47A, the corresponding cored solder balls 60, the corresponding connection pads 26, the corresponding via electrodes 27, the corresponding connection members 25, and the traces 23, respectively. As a result, when mounted in the RF IC mounting region R2, the RF IC chip 71 is electrically connected to the control IC chip 70 mounted in the control IC mounting region R1 via the above connection pads 42, traces 45, connection pads 47A, cored solder balls 60, connection pads 26, via electrodes 27, connection members 25, traces 23, and connection pads 22.

The connection pads 43 are electrically connected to the connection pads 47B by the corresponding traces 45, respectively. As shown in FIG. 1A, the connection pads 47B are electrically connected to respective via electrodes 51 which penetrate through the second board body 41 in its thickness direction. The via electrodes 51 are formed in part of through-holes 41X, respectively, which penetrate through the second board body 41 so as to reach its top surface 41A and bottom surface 41B. These through-holes 41X are filled with the respective via electrodes 51. The top ends of the via electrodes 51 are connected to the connection pads 47B, and their bottom ends are connected to the corresponding connection pads 50, respectively. Thus, the connection pads 47B and the corresponding connection pads 50 are electrically connected mutually by the via electrodes 51, respectively. The connection pads 50 are pads that are to be joined to part of cored solder balls 60 and electrically connected to external connection terminals 75, respectively. As shown in FIG. 6, the connection pads 50 are formed in a peripheral region of the bottom surface 41B of the second board body 41.

The via electrodes 51 and the connection pads 50 are made of copper or a copper alloy, for example. Although in the embodiment the through-holes 41X are filled with the via electrodes 51 made of a conductive material such as copper, via electrodes may be formed as plated through-hole vias in the respective through-holes 41X.

The connection pads 44 are electrically connected to the connection pads 47C by the ground lines 46, respectively. The connection pads 47C are to be electrically connected to the ground lines 24 of the first board 20 (see FIG. 4) via the corresponding cored solder balls 60, connection pads 26 (see FIG. 1B), and via electrodes 27 (see FIG. 1B). Therefore, the connection pads 44 are to be electrically connected to the ground lines 24 via the respective ground lines 46, the connection pads 47C, the corresponding cored solder balls 60, the corresponding connection pads 26, the corresponding via corresponding electrodes 27, the corresponding connection members 25, and the traces 23, respectively. As a result, when mounted in the RF IC mounting region R2, the RF IC chip 71 is electrically connected to the ground lines 24 via the above connection pads 44, ground lines 46, connection pads 47C, cored solder balls 60, connection pads 26, and via electrodes 27. The ground lines 46 are given the ground potential. The ground lines 46 may be made of copper or a copper alloy, for example.

As shown in FIGS. 1A and 1B and FIG. 3, the corresponding cored solder balls 60 are joined to the connection pads 47A-47C, respectively. These cored solder balls 60 are also joined to the respective connection pads 26 of the first board 20 (see FIG. 1A). That is, these cored solder balls 60 are sandwiched between the first board 20 and the second board 40, and their one ends are joined to the connection pads 26 and the other ends are joined to the connection pads 47A-47C. The cored solder balls 60 function as connection terminals for connecting (joining) the first board 20 and the second board 40 as well as spacers for keeping the distance between the first board 20 and the second board 40 at a prescribed value. The height of the cored solder balls 60 is set greater than the thickness of the RF IC chip 71 and the heights of the passive elements 72 and also greater than the thicknesses of the first board body 21 and the second board body 41. The height of the cored solder balls 60 can be set at about 0.8 to 1.2 mm, for example.

Each cored solder ball 60 has a structure that a spherical copper core ball 61 is surrounded by a solder layer 62. The solder layer 62 functions as a joining member and the copper core ball 61 functions as a spacer. That is, each cored solder ball 60 is joined to the associated connection pad 26 by the solder layer 62 and joined to the associated connection pad 47A, 47B, or 47C by the solder layer 62.

The cored solder balls 60 include cored solder balls 60A, 60B, 60C, 60D, 60E, and 60F which are part of the antenna 30.

Although actually the above-described traces 45 and ground lines 46 are covered with a solder resist layer, the solder resist layer is not shown in FIGS. 1A and 1B to facilitate understanding of the sectional structures of the individual members.

Next, the configuration of the antenna 30 will be described with reference to FIGS. 2-7. The antenna 30 used in the embodiment is an inverted-F antenna. The antenna 30 is electrically connected to the ground lines 24 and 46 which are formed on the first board 20 and the second board 40, respectively, and power lines (not shown).

The antenna 30 has first wiring members 31A-31C, first via electrodes 32A-32E, first wiring patterns 33A-33E, second wiring members 34A-34C, second via electrodes 35A-35E, second wiring patterns 36A-36F, and the cored solder balls 60A-60F.

The first wiring members 31A-31C (hereinafter may be referred to generically as first wiring members 31) are formed on the top surface 21A of the first board body 21. Like the above-described via electrodes 27, the first via electrodes 32A-32E (hereinafter may be referred to generically as first via electrodes 32) are formed in respective through-holes 21X which penetrate through the first board body 21 in its thickness direction. The first wiring patterns 33A-33E (hereinafter may be referred to generically as first wiring patterns 33) are formed on the bottom surface 21B of the first board body 21. Although not shown in any drawings, the first wiring patterns 33 used in the embodiment are, for example, approximately circular in a plan view.

The second wiring members 34A-34C (hereinafter may be referred to generically as second wiring members 34) are formed on the bottom surface 41B of the second board body 41. Like the above-described via electrodes 51, the second via electrodes 35A-35E (hereinafter may be referred to generically as second via electrodes 35) are formed in respective through-holes 41X which penetrate through the second board body 41 in its thickness direction. The second wiring patterns 36A-36F (hereinafter may be referred to generically as second wiring patterns 36) are formed on the top surface 41A of the second board body 41. Although not shown in any drawings, the second wiring patterns 36 used in the embodiment are, for example, approximately circular in a plan view. The cored solder balls 60A-60F are provided between the first board 20 and the second board 40. The first wiring members 31, the first via electrodes 32, the first wiring patterns 33, the second wiring members 34, the second via electrodes 35, and the second wiring patterns 36 are made of copper or a copper alloy, for example.

The first wiring member 31A is connected to the two first via electrodes 32A and 32B. As shown in FIG. 4, the first wiring member 31A has connection members C1 and C2 which are connected to the respective first via electrodes 32A and 32B and a wiring member W1 which connects the connection members C1 and C2. The connection members C1 and C2 and the wiring member W1 are integrated together. For example, the connection members C1 and C2 are approximately circular in a plan view and the wiring member W1 is approximately band-shaped in a plan view.

Figure 7:
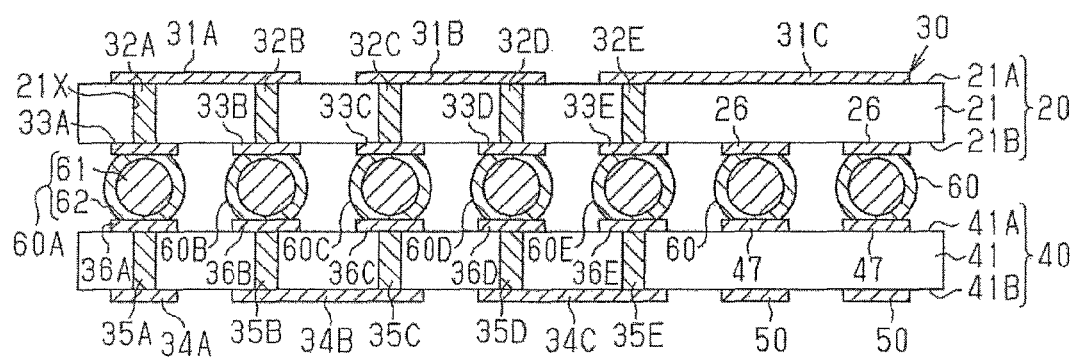
FIG. 7 is a schematic sectional view, taken along lines 7-7 in FIGS. 2 and 3, of an antenna used in the embodiment.

As shown in FIG. 7, the first via electrode 32A is electrically connected to the cored solder ball 60A by the first wiring pattern 33A. The cored solder ball 60A is joined to the second wiring member 34A via the second wiring pattern 36A and the second via electrode 35A. As a result, the first wiring member 31A is electrically connected to the second wiring member 34A via the first via electrode 32A, the first wiring pattern 33A, the cored solder ball 60A, the second wiring pattern 36A, and the second via electrode 35A. As shown in FIG. 6, the second wiring member 34A is, for example, approximately circular in a plan view.

On the other hand, as shown in FIG. 7, the first via electrode 32B is electrically connected to the cored solder ball 60B by the first wiring pattern 33B. The cored solder ball 60B is electrically connected to the second wiring member 34B via the second wiring pattern 36B and the second via electrode 35B. As a result, the first wiring member 31A is electrically connected to the second wiring member 34B via the first via electrode 32B, the first wiring pattern 33B, the cored solder ball 60B, the second wiring pattern 36B, and the second via electrode 35B.

The second wiring member 34B is connected to the two second via electrodes 35A and 35B. As shown in FIG. 6, the second wiring member 34B has connection members C11 and C12 which are connected to the respective second via electrodes 35A and 35B and a wiring member W11 which connects the connection members C11 and C12. The connection members C11 and C12 and the wiring member W11 are integrated together. For example, the connection members C11 and C12 are approximately circular in a plan view and the wiring member W11 is approximately band-shaped in a plan view. As shown in FIG. 7, the second via electrode 35C is electrically connected to the first wiring member 31B via the second wiring pattern 36C, the cored solder ball 60C, the first wiring pattern 33C, and the first via electrode 32C. As a result, the second wiring member 34B is electrically connected to the first wiring member 31B via the second via electrode 35C, the second wiring pattern 36C, the cored solder ball 60C, the first wiring pattern 33C, and the first via electrode 32C.

The first wiring member 31B is connected to the two first via electrodes 32C and 32D. As shown in FIG. 4, the first wiring member 31B has connection members C3 and C4 which are connected to the respective first via electrodes 32C and 32D and a wiring member W2 which connects the connection members C3 and C4. The connection members C3 and C4 and the wiring member W2 are integrated together. For example, the connection members C3 and C4 are approximately circular in a plan view and the wiring member W2 is approximately band-shaped in a plan view. As shown in FIG. 7, the first via electrode 32D is electrically connected to the second wiring member 34C via the first wiring pattern 33D, the cored solder ball 60D, the second wiring pattern 36D, and the second via electrode 35D. As a result, the first wiring member 31B is electrically connected to the second wiring member 34C via the first via electrode 32D, the first wiring pattern 33D, the cored solder ball 60D, the second wiring pattern 36D, and the second via electrode 35D.

The second wiring member 34C is connected to the two second via electrodes 35D and 35E. As shown in FIG. 6, the second wiring member 34C has connection members C13 and C14 which are connected to the respective second via electrodes 35D and 35E and a wiring member W12 which connects the connection members C13 and C14. The connection members C13 and C14 and the wiring member W12 are integrated together. For example, the connection members C13 and C14 are approximately circular in a plan view and the wiring member W12 is approximately band-shaped in a plan view. As shown in FIG. 7, the second via electrode 35E is electrically connected to the first wiring member 31C via the second wiring pattern 36E, the cored solder ball 60E, the first wiring pattern 33E, and the first via electrode 32E. As a result, the second wiring member 34C is electrically connected to the first wiring member 31C via the second via electrode 35E, the second wiring pattern 36E, the cored solder ball 60E, the first wiring pattern 33E, and the first via electrode 32E.

As shown in FIG. 4, the first wiring member 31C has a connection member C5 which is connected to the first via electrode 32E and wiring members W3 and W4, and a connection member C6. The connection members C5 and C6 and the wiring members W3 and W4 are integrated together. For example, the connection members C5 and C6 are approximately circular in a plan view and the wiring members W3 and W4 are approximately L-shaped in a plan view.

The wiring member W3 electrically connects the connection member C5 and the ground line 24. As a result, the entire antenna 30 is connected to the ground lines 24. The wiring member W4 electrically connects the wiring member W3 and the connection member C6. As a result, the connection member C5 is electrically connected to the connection member C6 via the wiring members W3 and W4. The connection member C6 is electrically connected to the cored solder ball 60F shown in FIG. 3 via a first via electrode 32 and a first wiring pattern 33 (neither of which is shown). The cored solder ball 60F is electrically connected to a connection member C21 of the second wiring pattern 36F (see FIG. 5).

The second wiring pattern 36F has the above-mentioned connection member C21, a connection member C22 which is formed in the RF IC mounting region R2, and a wiring member W21 which connects the connection members C21 and C22. The connection members C21 and C22 and the wiring member W21 are integrated together. For example, the connection members C21 and C22 are approximately circular in a plan view and the wiring member W21 is band-shaped in a plan view. The connection member C21 is electrically connected to the RF IC chip 71 which is mounted in the RF IC mounting region R2. As a result, the entire antenna 30 is electrically connected to the RF IC chip 71.

Although actually the above-described first wiring members 31A-31C, second wiring members 34A-34C, and wiring member W21 of the second wiring pattern 36F are covered with solder resist layers, the solder resist layers are not shown in FIGS. 1A and 7 to facilitate understanding of the sectional structures of the individual members. For example, connection pads 26 and 47 shown in FIG. 7 and the corresponding cored solder ball 60 are used for connection to signal lines for signal exchange between the control IC chip 70 and the RF IC chip 71 or as dummy pads and dummy connection terminals. The purpose of using them as dummy pads and dummy connection terminals is to increase the strength of the joining of the first board 20 and the second board 40 and join the first board 20 and the second board 40 together in such a manner that they are set parallel with each other. For example, the connection pads 50 shown in FIG. 7 are used for connection to signal lines for signal exchange between the RF IC chip 71, for example, and a mounting board or as dummy pads. Where they are used as dummy pads, external connection terminals 75 are formed on the respective dummy pads (connection pads 50) to increase the strength of the joining of the semiconductor device 10 and the mounting board and join the semiconductor device 10 and the mounting board together in such a manner that they are set parallel with each other.

Next, a description will be made of how advantages of the semiconductor device 10 are obtained. Part of the cored solder balls 60 which are connection terminals for joining and electrically connecting the first board 20 and the second board 40 are used as part of the antenna 30. With this measure, the height of these cored solder balls 60 (i.e., the interval between the first board 20 and the second board 40) can be utilized as part of the wiring length of the antenna 30, whereby the wiring length of the antenna 30 can easily be made long. Since the height of these cored solder balls 60 is greater than the thicknesses of the first board body 21 and the second board body 41, the wiring length of the antenna 30 can be set longer than in the conventional case in which the wiring length of the antenna 120 is increased utilizing the thickness of the board body 111.

Therefore, even in the case of designing a low-frequency antenna which requires a long wiring length, increase of the areas occupied by the first wiring members 31 and the first wiring patterns 33 or the second wiring members 34 and the first wiring patterns 36 can be prevented. In other words, even if the areas occupied by the first wiring members 31 are set small, the wiring length of the antenna 30 can be set to a desired length (e.g., a length suitable for a low frequency) by utilizing the length in the stacking direction of the first board body 21, the second board body 41 or the like. Since in this manner the horizontal area of the first board 20 and the second board 40 can be made small, the first board 20 and the second board 40, and hence the semiconductor device 10, can be miniaturized.

Figure 8A:
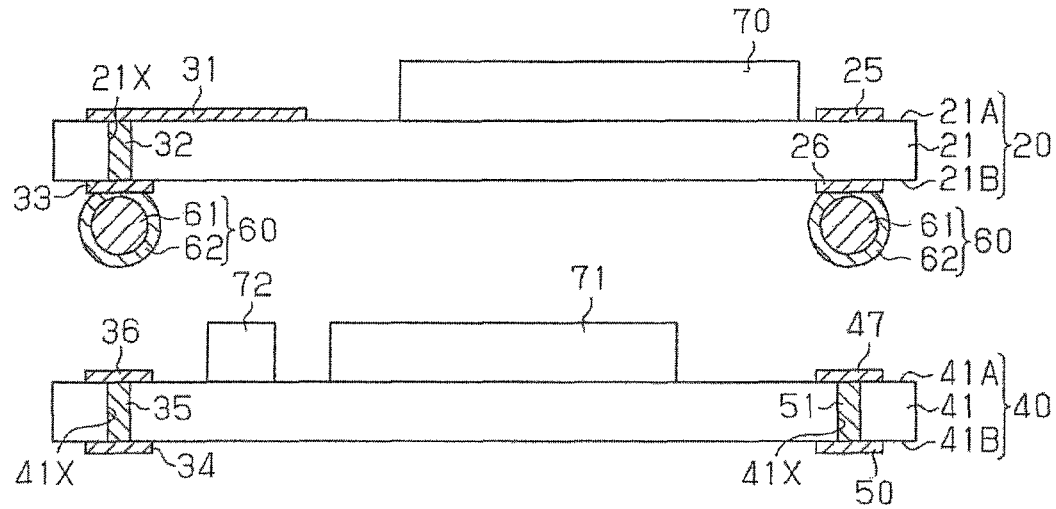
FIGS. 8A-8C are schematic sectional views showing a manufacturing method of the semiconductor device according to the embodiment.

Next, a manufacturing method of the semiconductor device 10 will be described. First, a first board 20 and a second board 40 are prepared as shown in FIG. 8A. Since the first board 20 and the second board 40 can be manufactured by known manufacturing methods, this manufacturing step will be described below briefly with reference to FIG. 8A.

The first board 20 is manufactured by forming through-holes 21X through a copper-clad laminate (CCL), for example, then forming first via electrodes 32 etc. in the respective through-holes 21X by electroplating, paste charging, or some other method, and finally forming first wiring members 31, the first wiring patterns 33 or the like by a subtractive method. Likewise, the second board 40 is manufactured by forming through-holes 41X through a copper-clad laminate, for example, then forming second via electrodes 35 in the respective through-holes 41X by electroplating, paste charging, or some other method, and finally forming second wiring members 34, the second wiring patterns 36 or the like by a subtractive method. Subsequently, a control IC chip 70 is mounted on the top surface 21A of the first board body 21 of the first board 20 (e.g., by flip-chip mounting or wire bonding). And an RF IC chip 71 and passive elements 72 are mounted on the top surface 41A of the second board body 41 of the second board 40 (e.g., by flip-chip mounting or soldering).

Furthermore, in the step shown in FIG. 8A, cored solder balls 60 are provided on (joined to) the first wiring patterns 33 and the connection pads 26 which are formed on the bottom surface 21B of the first board body 21. For example, after flux is applied to the first wiring patterns 33 and the connection pads 26 if necessary, cored solder balls 60 are provided on the first wiring patterns 33 and the connection pads 26 and fixed to them by reflow at about 230° C. to 260° C. Then the surface is cleaned and the flux is removed.

Subsequently, the first board 20 which is mounted with the control IC chip 70 and the cored solder balls 60 is disposed over the second board 40 which is mounted with the RF IC chip 71 and the passive elements 72. More specifically, as shown in FIG. 8A, the bottom surface 21B of the first board body 21 and the top surface 41A of the second board body 41 are opposed to each other and the first board body 21 and the second board body 41 are positioned with respect to each other so that the cored solder balls 60 are opposed to the connection pads 47 and the second wiring patterns 36.

Figure 8B:
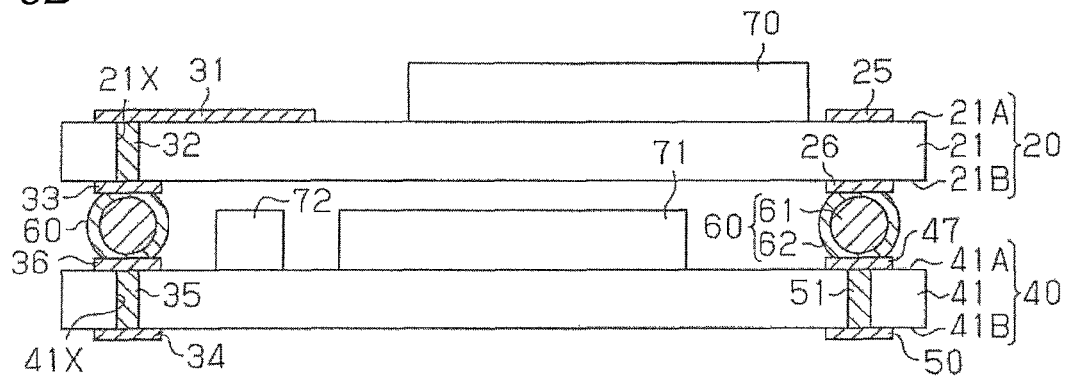

In the next step shown in FIG. 8B, the cored solder balls 60 are joined to the connection pads 47 and the second wiring patterns 36, respectively. More specifically, first, flux is applied to the connection pads 47 and the second wiring patterns 36 if necessary. Subsequently, the first board 20 is disposed on the second board 40 with the cored solder balls 60 sandwiched therebetween, and the thus-combined first board 20 and second board 40 are heated in a reflow furnace at about 230° C. to 260° C. The cored solder balls 60 are melted and joined to the connection pads 47 and the second wiring patterns 36. As a result, the first wiring members 31, the first via electrodes 32, the first wiring patterns 33, the cored solder balls 60, the second wiring patterns 36, the second via electrodes 35, and the second wiring members 34 are electrically connected mutually and thus an antenna 30 is formed. In this step, reflow is performed while the first board 20 is pressed against the second board 40, and the copper core balls 61 of the cored solder balls 60 function as spacers and keep the interval between the first board 20 and the second board 40 at a prescribed value.

Figure 8C:
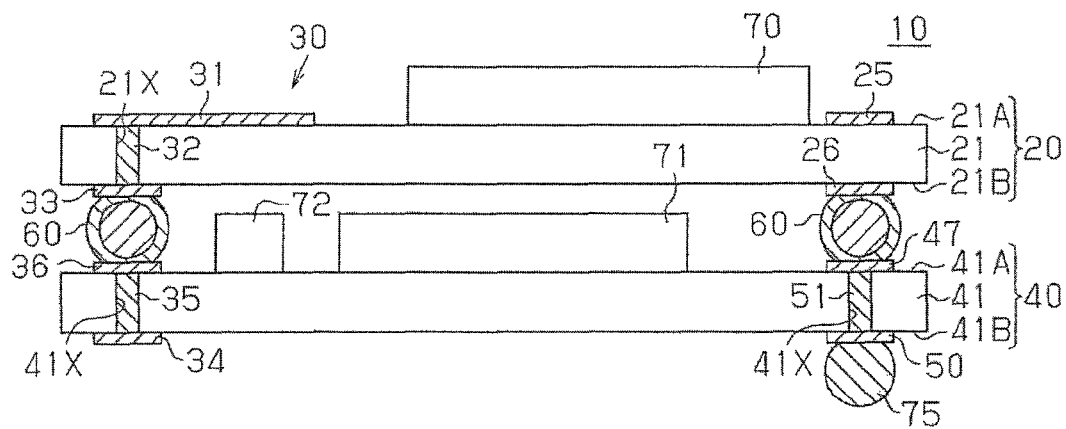

In the next step shown in FIG. 8C, external connection terminals 75 are formed on the respective connection pads 50. For example, after flux is applied to the connection pads 50 if necessary, the external connection terminals 75 are provided on the connection pads 50 and fixed to them by reflow at about 240° C. to 260° C. Then the surface is cleaned and the flux is removed. The manufacturing process of the semiconductor device 10 is thus completed.

The above-described embodiment provides the following advantages:

(1) Part of the cored solder balls 60 which are connection terminals for joining and electrically connecting the first board 20 and the second board 40 are used as part of the antenna 30. With this measure, the height of these cored solder balls 60 (i.e., the interval between the first board 20 and the second board 40) can be utilized as part of the wiring length of the antenna 30, whereby the wiring length of the antenna 30 can easily be made long. Since in this manner the horizontal area of the first board 20 and the second board 40 can be made small, the first board 20 and the second board 40, and hence the semiconductor device 10, can be miniaturized.

Since the height of these cored solder balls 60 is utilized as part of the wiring length of the antenna 30, the wiring length of the antenna 30 can be increased without increasing the horizontal area of the first board 20 and the second board 40 and the characteristics of the antenna 30 can thereby be improved.

(2) In addition to the above cored solder balls 60, the first via electrodes 32 formed through the first board body 21 and the second via electrodes 35 formed through the second board body 41 are used as part of the antenna 30. With this measure, in addition to the height of the above cored solder balls 60, the thicknesses of the first board body 21 and the second board body 41 can be utilized as part of the wiring length of the antenna 30, whereby the wiring length of the antenna 30 can be made long even more easily. Since in this manner the horizontal area of the first board 20 and the second board 40 can be made even smaller, the first board 20 and the second board 40, and hence the semiconductor device 10, can be miniaturized easily.

MODIFIED EMBODIMENTS

The above-described embodiment is applicable to modified embodiments described below.

In the above embodiment, the cored solder balls 60 are used as the connection terminals for connecting the first board 20 and the second board 40. Instead of the cored solder balls 60, connection terminals having spring characteristic (spring connection terminals), metal posts which are columnar connection terminals, or the like may be used as the connection terminals for connecting the first board 20 and the second board 40. In this case, part of the spring connection terminals, the metal posts, or the like are used as part of the antenna 30. Thus, the same advantages provided by the above embodiment can be obtained.

Figure 9:
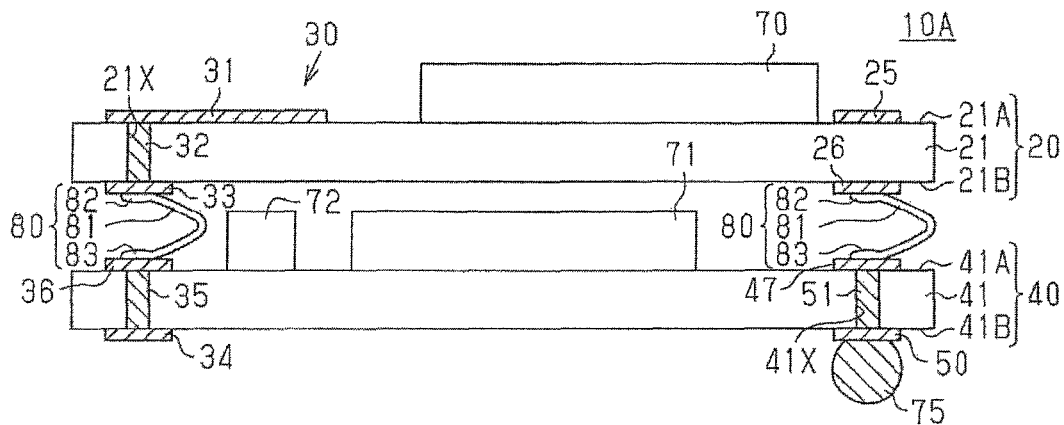
FIG. 9 is a schematic sectional view of a semiconductor device according to a modified embodiment.

FIG. 9 shows a semiconductor device 10A in which spring connection terminals 80 are used as the connection terminals for connecting the first board 20 and the second board 40.

As shown in FIG. 9, the spring connection terminals 80 are sandwiched between the first board 20 and the second board 40. One end of each spring connection terminal 80 is joined to a connection pad 26 or a first wiring pattern 33 and the other end is joined to a connection pad 47 or a second wiring pattern 36. Each spring connection terminal 80 has a spring portion 81 and joining portions 82 and 83 which are integrated together. The spring connection terminals 80 are made of a metal material having a proper level of elasticity (spring characteristic, bending characteristic) and can be manufactured by subjecting a thin metal sheet having a uniform thickness to punching such as stamping and then bending resulting pieces. Example materials of the thin metal sheet are copper-based alloys such as beryllium copper (Cu—Be), phosphor bronze (Cu—Sn), and Corson alloys (Cu—Ni—Si—Mg, Cu—Ni—Si, Cu—Ni—Co—Si—Cr, etc.).

The joining portion 82 is joined to the connection pad 26 or the first wiring pattern 33 which is formed on the bottom surface 21B of the first board body 21. For example, the joining portion 82 is soldered to the connection pad 26 or the first wiring pattern 33. The joining portion 82 is continuous with the top end of the spring portion 81, wider than the spring portion 81, and flat.

The joining portion 83 is joined to the connection pad 47 or the second wiring pattern 36 which is formed on the top surface 41A of the second board body 41. For example, the joining portion 83 is soldered to the connection pad 47 or the second wiring pattern 36. The joining portion 83 is continuous with the bottom end of the spring portion 81, wider than the spring portion 81, and flat.

The spring portion 81 is located between the joining portions 82 and 83, and is curved outward (i.e., so as to go away from the joining portions 82 and 83). For example, the spring portion 81 is C-shaped or inverted-C-shaped in a side view. Shaped in this manner, the spring portion 81 can be deformed elastically in its height direction (i.e., in the stacking direction of the first board 20 and the second board 40). The spring constant of the spring portion 81 may be set at about 0.6 to 0.8 N/mm, for example.

In the thus-configured semiconductor device 10A, part of the spring connection terminals 80 are used as part of the antenna 30. That is, the antenna 30 has the first wiring members 31, the first via electrodes 32, the first wiring patterns 33, the second wiring members 34, the second via electrodes 35, the second wiring patterns 36, and the spring connection terminals 80. The first wiring members 31, the first via electrodes 32, and the first wiring patterns 33 which are formed in the first board 20 are electrically connected to the second wiring members 34, the second via electrodes 35, and the second wiring patterns 36 which are formed in the second board 40 by the spring connection terminals 80.

Since part of the spring connection terminals 80 are used as part of the antenna 30, the lengths of these curved spring connection terminals 80 can be utilized as part of the wiring length of the antenna 30, whereby the wiring length of the antenna 30 can easily be made long.

In the above modification, the two end portions of each spring connection terminal 80 is joined to the connection pad 26 and 47, respectively, or the first wiring pattern 33 and the second wiring pattern 36, respectively. Alternatively, electrical continuity between the first board 20 and the second board 40 may be established by joining only one end portion (e.g., joining portion 83) of each spring connection terminal 80 to the connection pad 47 or the second wiring pattern 36 and pressing the connection pad 26 or the first wiring pattern 33 against the other end portion (e.g., joining portion 82).

In the above-described embodiment, the copper core ball 61 is used as the conductive core ball of each cored solder ball 60. Instead of the copper core ball 61, a conductive core ball made of a metal other than copper, such as gold or nickel or a resin core ball may be used. As a further alternative, a solder ball may be used instead of each cored solder ball 60 (i.e., no conductive core ball or resin core ball is used).

Figure 10:
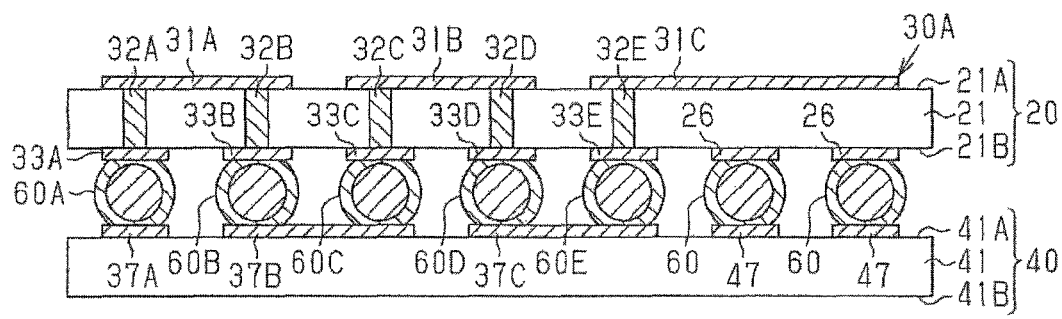
FIG. 10 is a schematic sectional view of a semiconductor device according to another modified embodiment.

In the above embodiment and modified embodiment, no particular limitations are imposed on the configuration of the antenna 30. For example, as shown in FIG. 10, an antenna 30A is possible which is different from the antenna 30 according to the embodiment in that the second via electrodes 35 and the second wiring members 34 are omitted. The antenna 30A has the first wiring members 31A-31C, the first via electrodes 32A-32E, the first wiring patterns 33A-33E, second wiring patterns 37A-37C, the cored solder balls 60A-60F, and the second wiring pattern 36F shown in FIG. 3. The first wiring members 31A-31C, the first via electrodes 32A-32E, and the first wiring patterns 33A-33E which are formed in the first board 20 are electrically connected, by the cored solder balls 60A-60F, to the second wiring patterns 37A-37C and 36F which are formed on the top surface 41A of the second board body 41. A semiconductor device that is equipped with the thus-configured antenna 30A provides the same advantages as the semiconductor device 10 according to the embodiment.

Another antenna is possible which is different from the antenna 30A in that the first wiring patterns 33A-33E are omitted. In this case, for example, the cored solder balls 60A-60E are joined to the bottom surfaces of the respective first via electrodes 32A-32E.

An antenna is possible which is different from the antenna 30 according to the embodiment in that conversely to the antenna 30A the first wiring members 31 and the first via electrodes 32 are omitted. The second wiring patterns 36 may further be omitted, in which case, for example, the cored solder balls 60A-60E are joined to the top surfaces of the respective second via electrodes 35A-35E.

Figure 11:
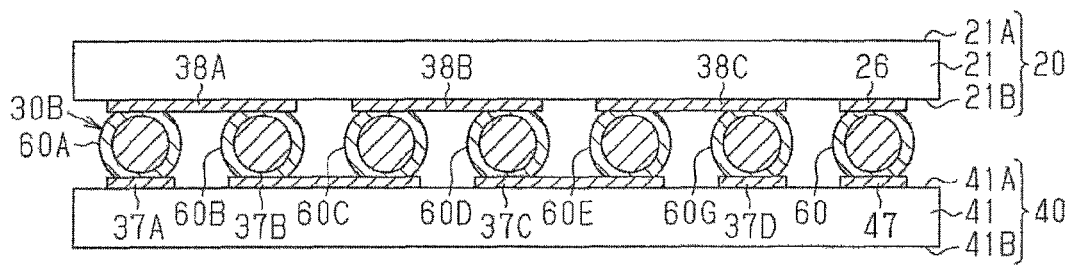
FIG. 11 is a schematic sectional view of a semiconductor device according to another modified embodiment.
Figure 12:
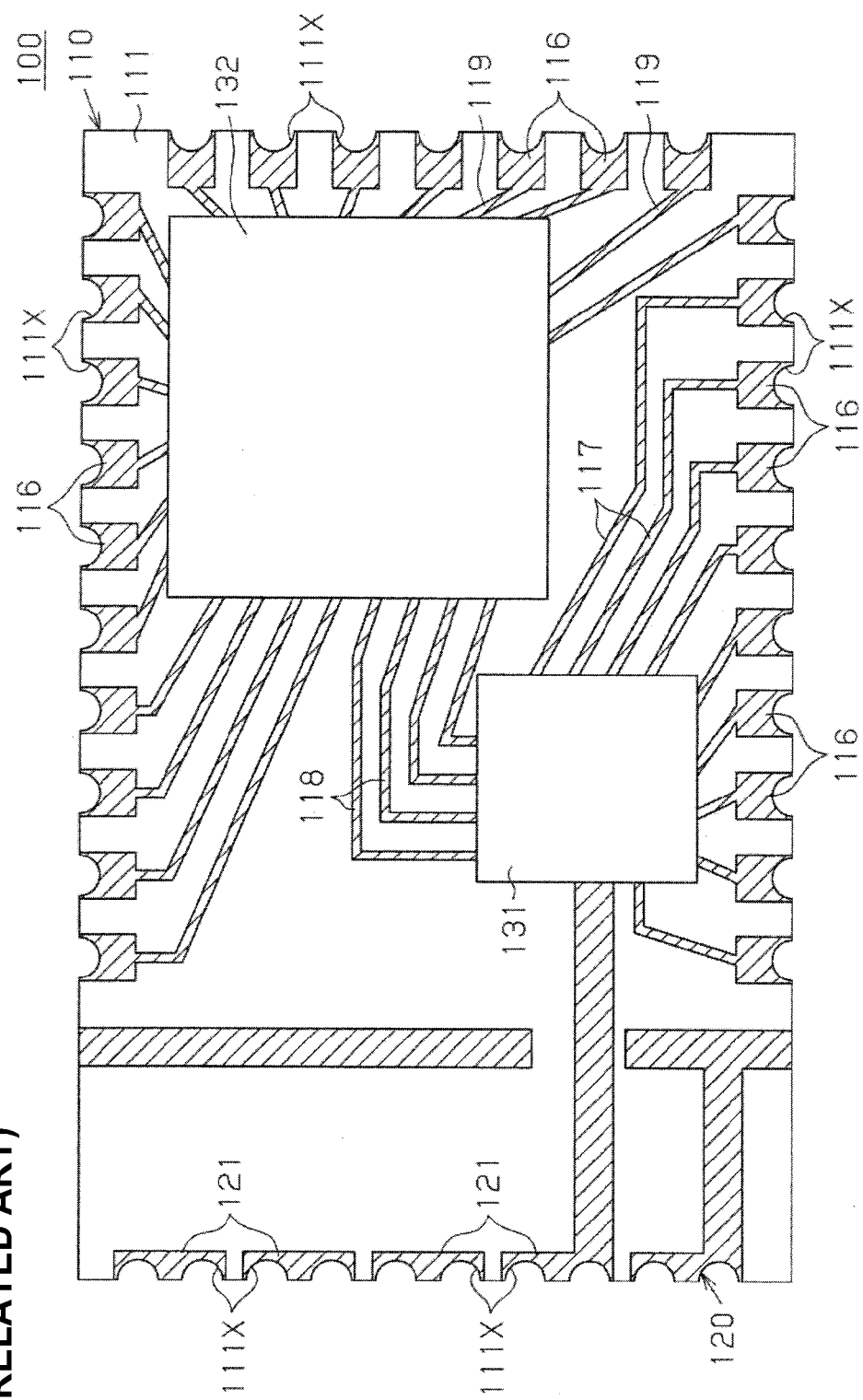
FIG. 12 is a schematic plan view of a semiconductor device in a related-art.
Figure 13:
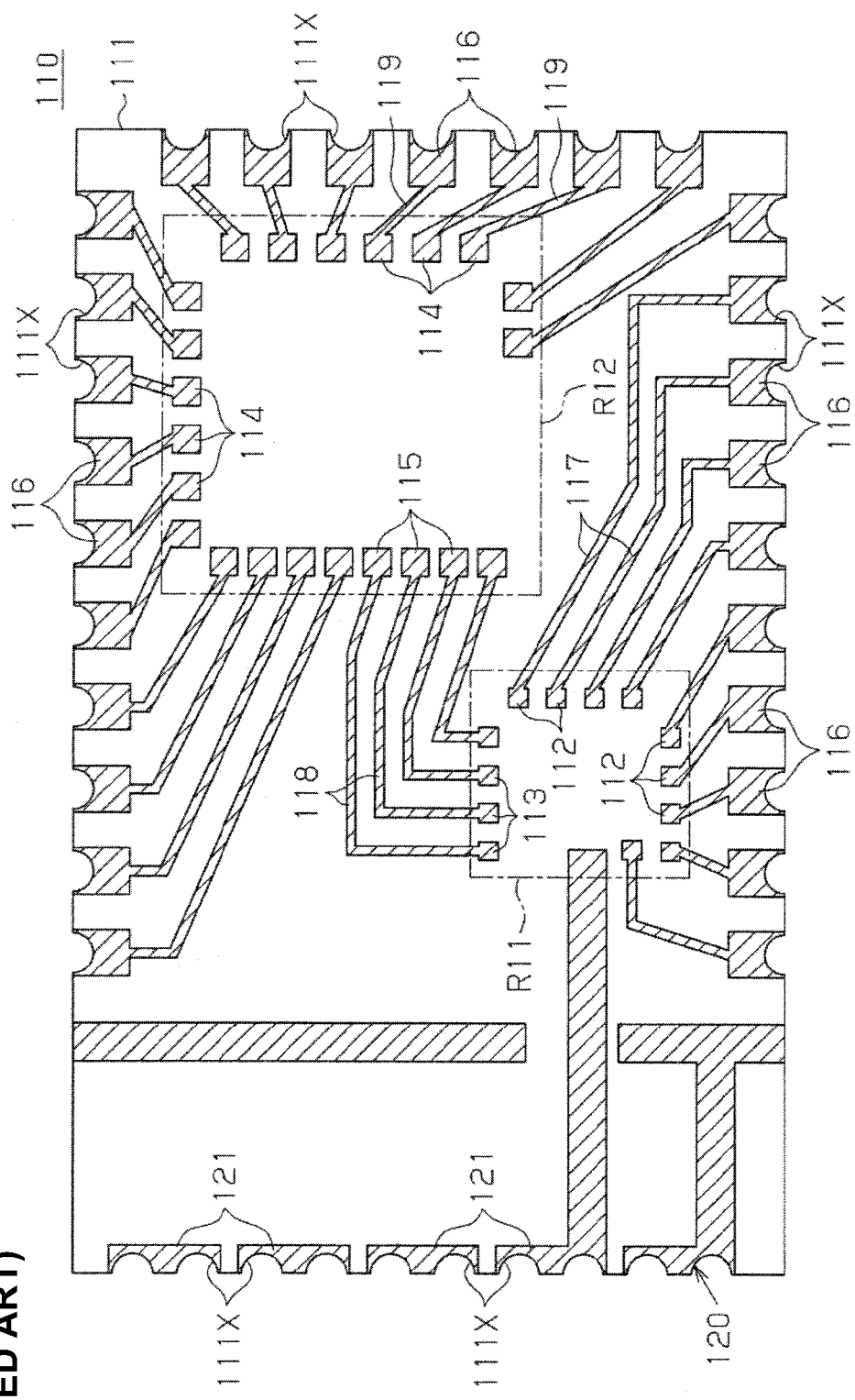
FIG. 13 is a schematic plan view of a wiring board used in the related-art semiconductor device of FIG. 12.
Figure 14:
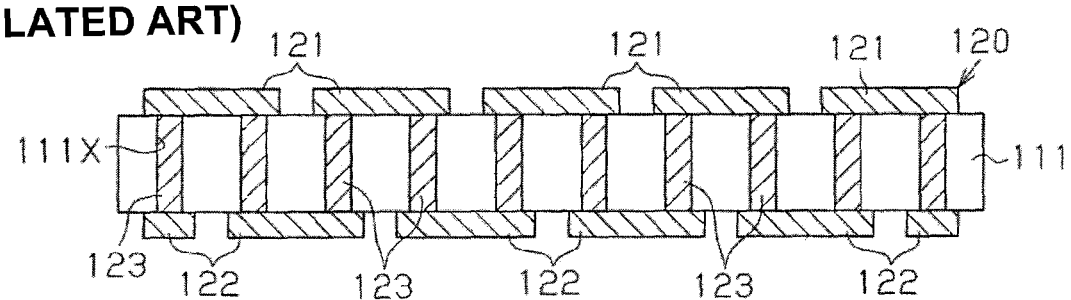
FIG. 14 is a schematic sectional view of an antenna in the related-art semiconductor device of FIG. 12.

As shown in FIG. 11, an antenna 30B is possible which is different from the antenna 30 according to the embodiment in that the first wiring members 31A-31C, the first via electrodes 32A-32E, the second via electrodes 35, and the second wiring members 34 are omitted. The antenna 30B has first wiring patterns 38A-38C, second wiring patterns 37A-37D, and cored solder balls 60A-60E and 60G. In the antenna 30B, the first wiring patterns 38A-38C are electrically connected to the second wiring patterns 37A-37D by the cored solder balls 60A-60E and 60G. For example, the second wiring patterns 37D extends to the RF IC mounting region R2 and is electrically connected to the RF IC chip 71 which is mounted in the RF IC mounting region R2. Although not shown in FIG. 11, the antenna 30B is electrically connected to the ground lines and a power line. A semiconductor device that is equipped with the thus-configured antenna 30B also provides the advantage (1) of the semiconductor device 10 according to the embodiment.

Electrodes corresponding to the first via electrodes 32 used in the embodiment or each modification may be formed on a side surface of the first board body 21 (or cuts formed in a side surface of the first board body 21).

Electrodes corresponding to the second via electrodes 35 used in the embodiment or each modified embodiment may be formed on a side surface of the second board body 41 (or cuts formed in a side surface of the second board body 41).

In the above embodiment, the space between the first board 20 and the second board 40 may be filled with a resin material which may be an insulative resin such as an epoxy resin or a polyimide resin. An epoxy resin, for example, mixed with a filler such as silica ($SiO_2$) may also be used as the resin material. A mold resin formed by transfer molding, compression molding, injection molding, or the like may also be used as the resin material.

Although the antenna used in the semiconductor device according to the embodiment or each modification is an inverted-F antenna, the concept of the embodiment or each modified embodiment may be applied to a semiconductor device having an antenna other than an inverted-F antenna, such as an inverted-L antenna.

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A semiconductor device comprising:
   a first board;
   a second board joined to the first board;
   a connection terminal provided between the first board and the second board and electrically connecting the first board and the second board, wherein the connection terminal is a solder ball;
   an electronic component on at least a first surface of the first board;
   a first wiring member on the first surface of the first board, wherein the first wiring member directly contacts the first surface of the first board;
   a first via electrode penetrating through the first board to reach the first surface of the first board and a second surface of the first board, which is opposite to the first surface of the first board, wherein the first via electrode is electrically connected to the first wiring member and the connection terminal;
   a second wiring member on a first surface of the second board, wherein the second wiring member directly contacts the first surface of the second board;
   a second via electrode penetrating through the second board to reach the first surface of the second board and a second surface of the second board, which is opposite to the first surface of the second board, wherein the second via electrode is electrically connected to the second wiring member and the connection terminal;
   a first wiring pattern on the second surface of the first board and connected to the first via electrode and the connection terminal, wherein the first wiring pattern directly contacts the second surface of the first board; and
   a second wiring pattern on the second surface of the second board and connected to the second via electrode and the connection terminal, wherein the second wiring pattern directly contacts the second surface of the second board,
   wherein all of the connection terminal, the first wiring member, the first via electrode, the second wiring member, the second via electrode, the first wiring pattern, and the second wiring pattern serve as an antenna.

2. The semiconductor device according to claim 1, wherein the solder ball is a cored solder ball comprising a core ball and a solder layer covering a surface of the core ball.

3. The semiconductor device according to claim 1, further comprising a plurality of connection terminals each identical to the connection terminal, a plurality of first wiring members each identical to the first wiring member, a plurality of first via electrodes each identical to the first via electrode, a plurality of second wiring members each identical to the second wiring member, a plurality of second via electrodes each identical to the second via electrode, a plurality of first wiring patterns each identical to the first wiring pattern, and a plurality of second wiring patterns each identical to the second wiring pattern, wherein all of the plurality of connection terminals, the plurality of first wiring members, the plurality of first via electrodes, the plurality of second wiring members, the plurality of second via electrodes, the plurality of first wiring patterns, and the plurality of second wiring patterns serve as the antenna, and wherein an adjacent pair of connection terminals is connected via a single one of the plurality of first wiring members connected to a pair of first via electrodes associated with said adjacent pair of connection terminals, and a different adjacent pair of connections terminals is connected via a single one of the plurality of second wiring members connected to a pair of second via electrodes associated with said different adjacent pair of connection terminals.

4. The semiconductor device according to claim 1, wherein at least a part of the connection terminal is at a same height as the electronic component.

5. The semiconductor device according to claim 1, wherein the electronic component is disposed between the first surface of the first board and the second surface of the second board.

6. A semiconductor device, comprising:
a first board;
a second board joined to the first board;
a connection terminal provided between the first board and the second board and electrically connecting the first board and the second board, wherein the connection terminal is a solder ball;
an electronic component on at least a first surface of the first board;
a first wiring member on the first surface of the first board, wherein the first wiring member directly contacts the first surface of the first board;
a first via electrode penetrating through the first board to reach the first surface of the first board and a second surface of the first board, which is opposite to the first surface of the first board, wherein the first via electrode is electrically connected to the first wiring member and the connection terminal; and
a second wiring pattern on a surface of the second board, which faces the first surface of the first board, and electrically connected to the connection terminal, wherein the second wiring pattern directly contacts the surface of the second board,
wherein all of the connection terminal, the first wiring member, the first via electrode, and the second wiring pattern serve as an antenna.

7. The semiconductor device according to claim 6, wherein the solder ball is a cored solder ball comprising a core ball and a solder layer covering a surface of the core ball.

8. The semiconductor device according to claim 6, further comprising a plurality of connection terminals each identical to the connection terminal, a plurality of first wiring members each identical to the first wiring member, a plurality of first via electrodes each identical to the first via electrode, and a plurality of second wiring patterns each identical to the second wiring pattern,
wherein all of the plurality of connection terminals, the plurality of first wiring members, the plurality of first via electrodes, and the plurality of second wiring patterns serve as the antenna, and
wherein an adjacent pair of connection terminals is connected via a single one of the plurality of first wiring members connected to a pair of first via electrodes associated with said adjacent pair of connection terminals, and a different adjacent pair of connections terminals is connected via a single one of the plurality of second wiring patterns directly connected to said different adjacent pair of connection terminals.

9. The semiconductor device according to claim 6, wherein at least a part of the connection terminal is at a same height as the electronic component.

10. The semiconductor device according to claim 6, wherein the electronic component is disposed between the first surface of the first board and the second surface of the second board.

11. A semiconductor device, comprising:
a first board;
a second board joined to the first board;
a connection terminal provided between the first board and the second board and electrically connecting the first board and the second board, wherein the connection terminal is a solder ball;
an electronic component on at least a first surface of the first board;
a first wiring pattern on a second surface of the first board, which is opposite to the first surface of the first board and faces the second board, and electrically connected to the connection terminal, wherein the first wiring pattern directly contacts the second surface of the first board; and
a second wiring pattern on a surface of the second board, which faces the first surface of the first board, and electrically connected to the connection terminal, wherein the second wiring pattern directly contacts the surface of the second board,
wherein all of the connection terminal, the first wiring pattern, and the second wiring pattern serve as the antenna.

12. The semiconductor device according to claim 11, wherein the solder ball is a cored solder ball comprising a core ball and a solder layer covering a surface of the core ball.

13. The semiconductor device according to claim 11, further comprising a plurality of connection terminals each identical to the connection terminal, a plurality of first wiring patterns each identical to the first wiring pattern, and a plurality of second wiring patterns each identical to the second wiring pattern,
wherein all of the plurality of connection terminals, the plurality of first wiring patterns, and the plurality of second wiring patterns serve as the antenna, and
wherein an adjacent pair of connection terminals is connected via a single one of the plurality of first wiring patterns directly connected to said adjacent pair of connection terminals, and a different adjacent pair of connections terminals is connected via a single one of the plurality of second wiring patterns directly connected to said different adjacent pair of connection terminals.

14. The semiconductor device according to claim 11, wherein at least a part of the connection terminal is at a same height as the electronic component.

15. The semiconductor device according to claim 11, wherein the electronic component is disposed between the first surface of the first board and the second surface of the second board.

* * * * *